United States Patent [19]
Kikkawa et al.

[11] Patent Number: 5,844,303
[45] Date of Patent: Dec. 1, 1998

[54] SEMICONDUCTOR DEVICE HAVING IMPROVED ELECTRONIC ISOLATION

[75] Inventors: Toshihide Kikkawa; Tatsuya Ohori; Hirosato Ochimizu, all of Kawasaki, Japan

[73] Assignee: Fujitsu Limited, Kawasaki, Japan

[21] Appl. No.: 214,600

[22] Filed: Mar. 17, 1994

Related U.S. Application Data

[63] Continuation-in-part of Ser. No. 945,632, Oct. 19, 1992, abandoned.

[30] Foreign Application Priority Data

Feb. 19, 1991 [JP] Japan ................................. 3-024319
Mar. 19, 1993 [JP] Japan ................................. 5-060594

[51] Int. Cl.$^6$ ................................................. H01L 29/167
[52] U.S. Cl. ..................... 257/609; 257/40; 257/190; 438/510; 438/518; 438/99
[58] Field of Search ................................... 257/607–612, 257/40, 190, 194, 131; 437/96, 107; 438/510, 518

[56] References Cited

U.S. PATENT DOCUMENTS

| | | | |
|---|---|---|---|
| 4,253,887 | 3/1981 | Jolly | 148/175 |
| 4,632,710 | 12/1986 | Van Rees | 257/284 |
| 4,935,381 | 6/1990 | Speckman et al. | 437/107 |
| 5,116,455 | 5/1992 | Daly | 437/96 |
| 5,332,451 | 7/1994 | Hata et al. | 148/33.2 |

FOREIGN PATENT DOCUMENTS

| | | |
|---|---|---|
| 0180457 | 5/1986 | European Pat. Off. . |
| 61-075531 | 4/1986 | Japan . |
| 63-127530 | 5/1988 | Japan . |
| 1220432 | 9/1989 | Japan . |
| 0328822 | 11/1992 | Japan . |

OTHER PUBLICATIONS

Hida et al., "High–Speed and Large Noise Margin Tolerance E/D Logic Gates with LDD Structure DMT's Fabricated Using Selective RIE Technology", *IEEE Transactions on Electron Devices*, vol. 36, No. 10, Oct. 1989, New York, US, pp. 2223–2230.

Kastalsky et al., "A Field–Effect Transistor with a Negative Differential Resistance", *IEEE Electron Device Letters*, vol. EDL–5, No. 2, 2 Feb. 1984, New York, US, pp. 57–60.

Musolf et al., "Substituted Arsines AS As Sources in Mombe", *Journal of Crystal Growth*, vol. 105, No. 1/4, 1 Oct. 1990, Amsterdam, NL, pp. 271–274.

Hiruma et al., "Improved Performance of Submicrometer–Gate GaAs MESFET's with an $Al_{0.3}Ga_{0.7}$ as Buffer Layer Grown by Metal Organic Vapor Phase Epitaxy", *IEEE Transactions on Electron Devices*, vol. 36, No. 2, Feb. 1989, New York, US, pp. 314–318.

Asbeck et al., "GaAs/(Ga,Al) as Heterojunction Bipolar Transistors with Buried Oxygen–Implanted Isolation Layers", *IEEE Electron Device Letters*, vol. EDL–5, No. 8, Aug. 1984, New York, US, pp. 310–312.

*Primary Examiner*—David B. Hardy
*Attorney, Agent, or Firm*—Greer, Burns & Crain, Ltd.

[57] ABSTRACT

A semiconductor device includes a buffer layer of AlGaAs that contains oxygen with a concentration level in the approximate range of $8\times10^{17}$ cm$^{-3}$ to $6\times10^{19}$ cm$^{-3}$, and carbon with a concentration level in the approximate range of $2\times10^{16}$ cm$^{-3}$ to $2\times10^{17}$ cm$^{-3}$. A lattice constant of the AlGaAs buffer layer is larger than a lattice constant of the GaAs substrate so a lattice misfit of the AlGaAs layer with respect to the GaAs substrate is equal to or varies by no more than $2\times10^5$ from a corresponding lattice misfit between an undoped AlGaAs crystal with respect to the GaAs substrate. Oxygen atoms occupy an interstitial site, creating a deep impurity level that suppresses side gate effect.

5 Claims, 15 Drawing Sheets

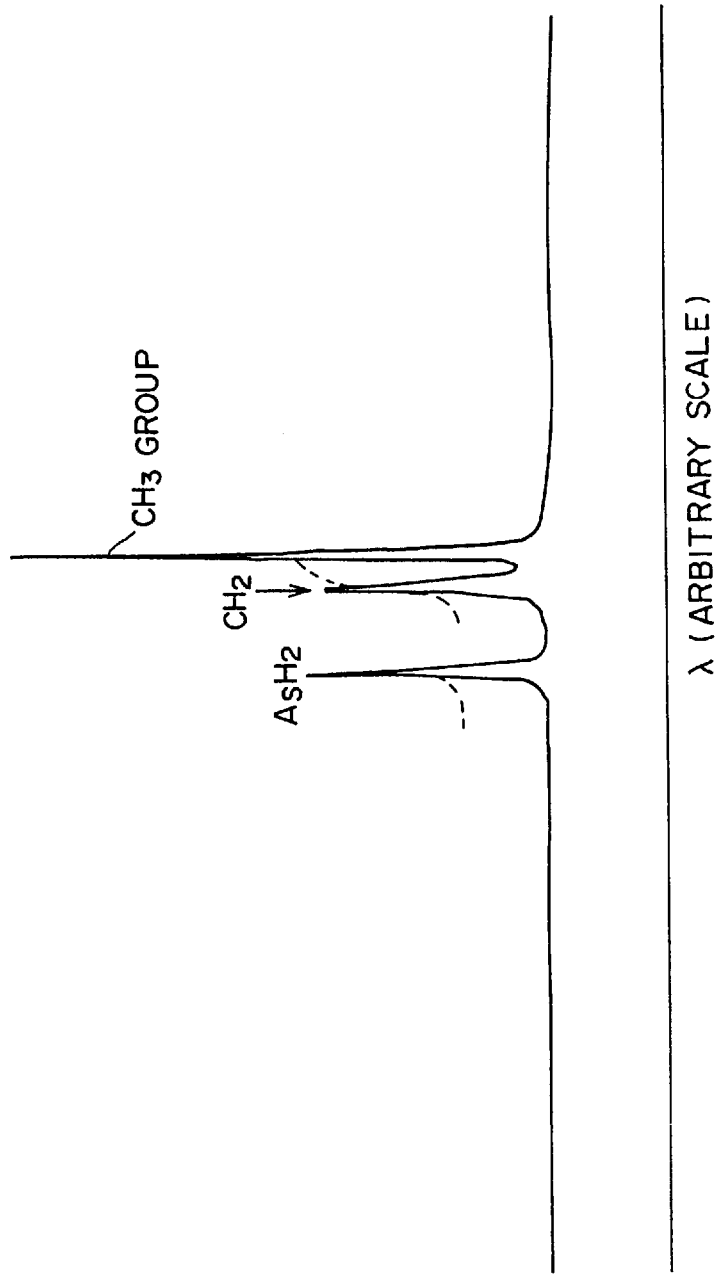

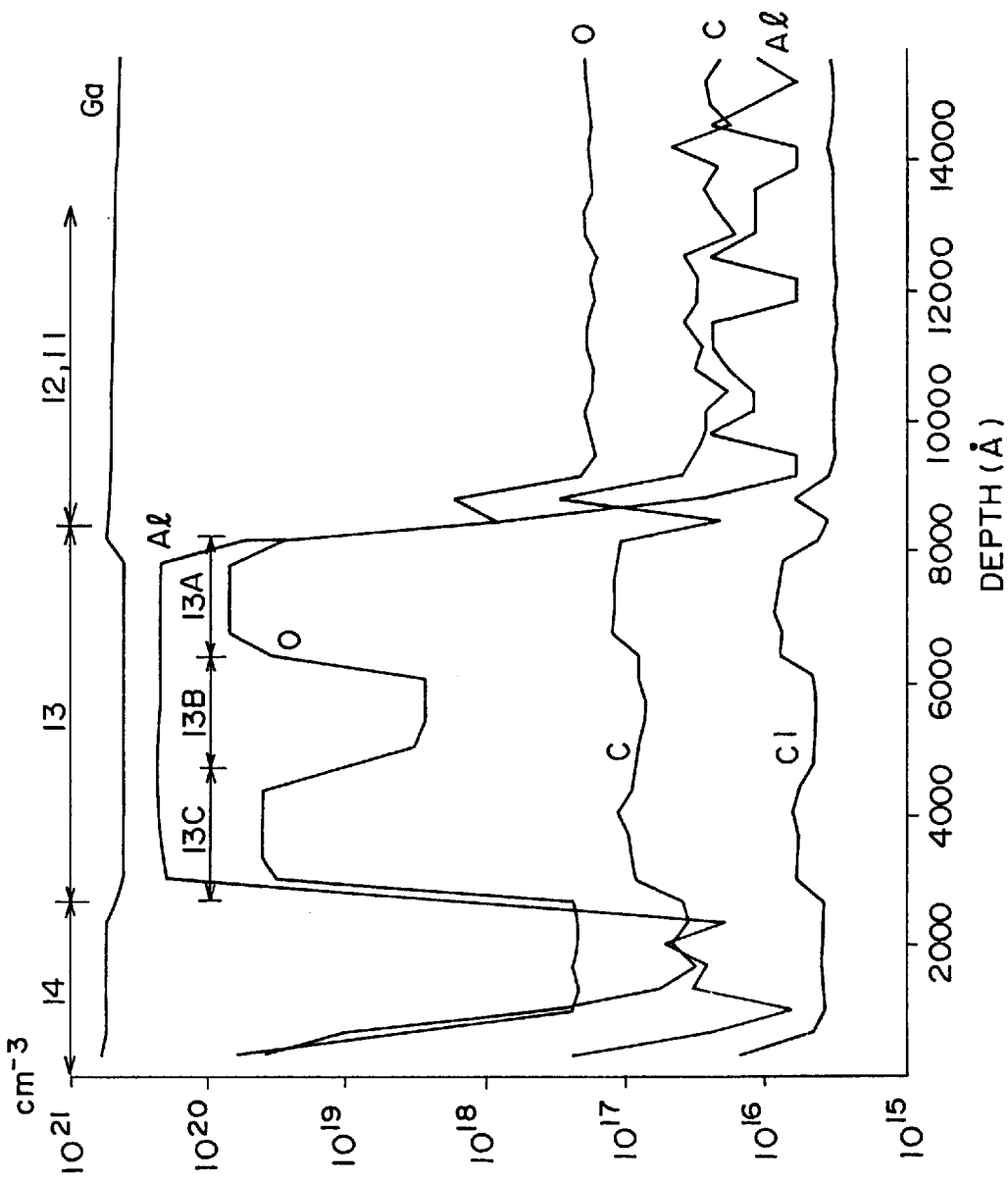

F I G. 14
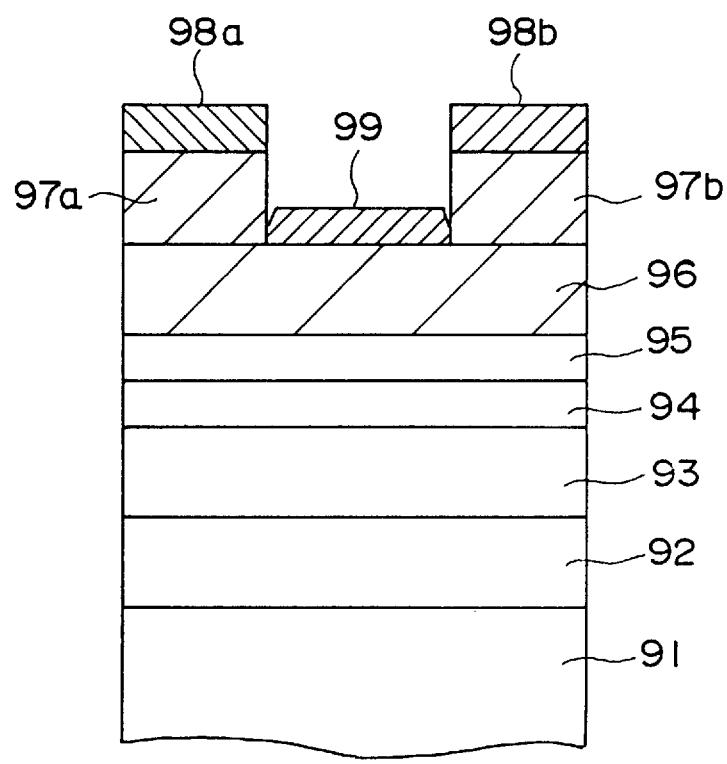

S113

S111

S116

S120

SEMICONDUCTOR DEVICE HAVING IMPROVED ELECTRONIC ISOLATION

CROSS-REFERENCE TO RELATED APPLICATIONS

The present invention is a continuation-in-part application of the pending United States patent application Ser. No. 07/945,632 filed Oct. 19, 1992, now abandoned.

BACKGROUND OF THE INVENTION

The present invention generally relates to semiconductor devices and more particularly to the fabrication of a compound semiconductor device that includes a layer of group III-V compound semiconductor material.

In the integrated circuit of semiconductor devices, it is essential to achieve a device isolation between adjacent devices. In the silicon devices, such an isolation can be achieved relatively easily by forming a film of silicon oxide. In the integrated circuit of semiconductor devices that use the group III-V compound semiconductor material for the essential part of the device, the device isolation raises a problem as the formation of the device isolation region by the oxidation process is generally not possible in such a device.

In order to achieve the effective device isolation in the group III-V semiconductor devices, it has been practiced to incorporate the so-called deep impurity elements into the semiconductor layer. When such deep impurity elements are incorporated, a pinning of the Fermi level occurs generally at the center of the forbidden band and the semiconductor material shows an increased resistivity.

Conventionally, the foregoing incorporation of the deep impurity elements has been achieved by using the ion implantation technique. In this technique, the elements such as oxygen or chromium are introduced into the semiconductor layer in correspondence to the region located between adjacent devices to form an isolation region that extends from the surface of the device toward the substrate.

FIG. 1 shows an example of the conventional device that employs such a device isolation.

Referring to FIG. 1, the device is a typical HEMT and includes a channel layer 3 of undoped GaAs and an electron supplying layer 5 of n-type AlGaAs that is provided on the channel layer 3 with an undoped spacer layer of AlGaAs interposed therebetween. Further, a cap layer 6 of n-type GaAs is provided on the electron supplying layer 5, and another cap layer 7 that contains layers of n-type AlGaAs and n-type GaAs is provided further on the cap layer 7. On the cap layer 7, a number of gate electrodes 8A, 8B, ... are provided in correspondence to a number of devices formed on the substrate.

In order to isolate the individual devices, the device of FIG. 1 uses an isolation region 9 that is formed in correspondence to the boundary between adjacent devices such that the region 9 extends from the surface of the layer 9 toward the substrate 1, passing through the layers 3–7. Typically, the region 9 is formed by incorporating oxygen or chromium ions by an ion implantation process and has an increased resistivity due to the foregoing pinning of the Fermi level. Thereby, the passage of the carriers from one device to another device is prevented.

Further, the foregoing layers 3–7 forming the active part of the device are formed on a semi-insulating GaAs substrate 1 that is covered with a buffer layer 2 such that the buffer layer 2 isolates the active part of the device from various adversary surface states or defects that are formed on the surface of the substrate 1. Typically, the buffer layer 2 is formed of an undoped AlGaAs and has a large resistivity. Thereby, each device is laterally isolated by the device isolation region 9 and vertically by the buffer layer 2, and the penetration of the carriers from one device to an adjacent device is prevented.

In such a conventional isolation structure, there exists a problem in that, although the penetration of the carriers from one device to the adjacent device can be minimized, the shielding of the electric field between the devices cannot be achieved successfully. It should be noted that the high purity buffer layer 2 lacks electric charges therein and passes the line of electric force and hence the electric field freely. Thereby, the electric field of one device penetrates into the region of the adjacent device and the operational characteristic of the device such as the threshold voltage tends to be influenced by the state of the adjacent device. In other words, the conventional device of FIG. 1 cannot eliminate the so-called side gate effect satisfactorily. It will be easily understood that the side gate effect becomes conspicuous with increasing integration density and decreasing separation between the devices.

In order to eliminate the foregoing problem, there is a proposal to form the buffer layer such that the buffer layer includes electric charges.

FIG. 2 shows a conventional process for achieving such an elimination of the side gate effect.

Referring to the drawing showing the case for growing a device on a silicon substrate 1A, a first buffer layer 2C of semi-insulating GaAs layer is provided on the substrate 1A for achieving a lattice matching, and a semi-insulating second buffer layer 2A of AlGaAs is grown on the first buffer layer 2C such that the buffer layer 2A contains oxygen ions therein. As a result of the electric charges incorporated in the layer 2A in the form of oxygen ions, the buffer layer 2A can now interrupt the electric field penetrating from the adjacent devices and the side gate effect is effectively eliminated. Further, the oxygen ions form the deep impurity level in the AlGaAs crystal and the buffer layer 2A shows a high resistivity as a result of the pinning of the Fermi level similarly to the device isolation region 9. On the first buffer layer 2A, the layers 3–7 are grown similarly to the structure shown in FIG. 1.

In the structure of FIG. 2, the buffer layer 2A has to be grown under the existence of oxygen. For example, the buffer layer 2A may be grown by admixing small amount of oxygen or water vapor into the source of Al, Ga and As. However, oxygen is a chemically active species and the oxygen molecules thus introduced easily cause reaction with the wall of the reaction vessel or piping systems. Once adsorbed, the oxygen molecules tend to stick on the vessel wall even after repeated flushing, and causes a contamination of the essential part of the device such as the channel layer 3. In order to avoid this problem, one may use a different epitaxial apparatuses for fabricating the semiconductor device such that the essential part of the device is grown in an apparatus that is different from the apparatus used for growing the buffer layer 2A. However, the use of such separate apparatuses inevitably necessitates a transportation step of taking out the half product from the reaction vessel of the first apparatus and mount the same on the reaction vessel of the second apparatus for further epitaxial process. During the transportation, it will be easily understood that the surface of the buffer layer 2A may be contaminated. In the device such as HEMT, such a contamination of the buffer layer 2A is unacceptable, as the channel layer 3 that forms the most critical part of the device is grown directly on the buffer layer 2A.

In order to eliminate the foregoing problem of contamination and to obtain a buffer layer of AlGaAs that contains oxygen ions as the impurity, there is a proposal in the Japanese Laid-open Patent Application No. 1-220432 to use an organic molecule that contains oxygen for the source of the group III element during the growth of the buffer layer. According to this proposal, an organic source such as trimethoxy gallium or trimethoxy aluminum is used for the source of oxygen and simultaneously for the source of the group III element. The organic source thus supplied decomposes in the reaction vessel in the vicinity of the substrate and release the group III element and oxygen. The oxygen atoms thus released in turn are combined immediately with Al atoms that are released also in the vicinity of the substrate because of the large affinity between aluminum and oxygen, and Al and O are deposited on the surface of the substrate without causing substantial contamination of the reaction vessel. By supplying oxygen in the form of stable organic molecules, one can avoid the contamination of the piping system as well.

In this conventional process, however, there arises a problem in that one cannot supply sufficient amount of oxygen into the reaction vessel and hence into the buffer layer. It should be noted that the flowrate of the organic source of the group III element determines the growth rate as well as the composition of the epitaxial layer and has to be controlled precisely. Generally, the flowrate of the organic source of the group III elements is substantially smaller than the flowrate of the source of the group V element. Thereby, the concentration of the oxygen in the reaction vessel after the decomposition becomes inevitably low. Therefore, this process does not provide the buffer layer having the desired device isolation effect.

SUMMARY OF THE INVENTION

Accordingly, it is a general object of the present invention to provide a novel and useful process for fabricating a semiconductor device as well as a semiconductor device fabricated according to such a process, wherein the foregoing problems are eliminated.

Another and more specific object of the present invention is to provide an optimized process for fabricating a semiconductor device having a semi-insulating semiconductor layer that contains oxygen ions with a high concentration level.

Another and more specific object of the present invention is to provide a semiconductor device that includes a buffer layer of a group III-V compound semiconductor material that contains oxygen ions therein and a fabrication process thereof, said buffer layer supporting thereon a plurality of active devices, wherein the side gate effect is substantially eliminated between the active devices on said buffer layer and wherein a hysteresis loop is eliminated in the operation of each of said active devices.

Another object of the present invention is to provide a semiconductor device, comprising: a substrate; an active layer of a compound semiconductor material provided on said substrate, said active layer including an active device; and a buffer layer of a compound semiconductor material provided between said substrate and said active layer, said buffer layer containing oxygen and carbon with a level exceeding $1 \times 10^{18}$ cm$^{-3}$ and a level lower than $5 \times 10^{17}$ cm$^{-3}$ respectively.

Another object of the present invention is to provide a method for fabricating a semiconductor device, comprising the steps of: supplying the molecules of an organic compound of a group V element that contains oxygen in the molecule in addition to the group V element; and decomposing the molecules of the organic compound to release said group V element and oxygen on a substrate to form a buffer layer; said step of decomposing the molecules being carried out at a temperature of 630° C. or more.

According to the present invention as outlined above, the oxygen incorporated into the buffer layer forms a deep impurity level that terminates the line of electric forces created by shallow impurities in the valence band. Thereby, the oxygen dopant thus incorporated into the buffer layer effectively eliminates the side gate effect of the semiconductor device. By optimizing the condition of deposition of the buffer layer as set forth above, one can set the effective concentration of the oxygen that is activated in the buffer layer and acts as the deep donor, to be larger than the concentration of carbon in the buffer layer, which carbon being incorporated into the buffer layer together with oxygen and acting as a shallow donor. Thereby, the line of electric forces created by the holes released by carbon is effectively terminated by the activated oxygen, and the side gate effect is suppressed.

Further, as a result of the increased effective concentration of the activated oxygen in the buffer layer, the proportion of the oxygen dopants acting as the shallow impurity in the buffer layer is reduced, and there occurs no substantial release or capture of carriers by such oxygen dopants. Thereby, the problem of the semiconductor device showing a hysteresis loop in the operational characteristics in response to an oscillating electric field is substantially reduced.

The buffer layer that contains oxygen primarily as the deep impurity as in the case of the present invention, has a lattice constant close to the lattice constant of the crystal that forms the buffer layer not doped with oxygen. This indicates that oxygen is incorporated into an interstitial site between the site for the group III element and the site for the group V element. When the buffer layer contains oxygen in the inappropriate site such as the arsenic site of AlGaAs, on the other hand, there occurs a substantial decrease of the lattice constant as compared with the case where the buffer layer contains oxygen in the interstitial site. Thus, the buffer layer that contains oxygen in the form of deep impurity shows a lattice constant that is close to the undoped material.

Other objects and further features of the present invention will become apparent from the following detailed description of preferred embodiments when read in conjunction with the attached drawings.

BRIEF DESCRIPTION OF THE DRAWINGS

FIG. 3 is a diagram showing the FTNMR spectrum of the organic source of the group V element that is used in the epitaxial process of the present invention;

FIG. 5 is a diagram showing the result of the SIMS analysis for the epitaxial structure obtained in the first embodiment of the present invention;

FIG. 14 is a diagram showing the structure of HEMT according to a seventh embodiment of the present invention;

DETAILED DESCRIPTION OF PREFERRED EMBODIMENTS

Hereinafter, a first embodiment of the present invention will be described.

In the first embodiment, an epitaxial layer of oxygen-containing AlGaAs is grown by an MOCVD process that employs organic or inorganic gases for the source of the group III and group V elements. As usual in the MOCVD process, organic source materials such as TMG (trimethyl gallium) and TMA (trimethyl aluminum) are introduced into a reaction vessel in which a substrate of a compound semiconductor material such as GaAs is supported, together with arsine ($AsH_3$) that acts as a source of As. As a result of the pyrolysis of the organic molecules, the elements such as Al and Ga are released and deposited on the suitable site of the GaAs crystal that forms the substrate together with As that is released by the pyrolysis of arsine.

In order to form the AlGaAs layer to have a high resistivity and high concentration of oxygen ions, the present invention employs tertiary buthoxy arsine (tBOAs; $C_4H_9OAsH_2$) as another source of As. As will be described detail in later, the tertiary buthoxy arsine is usually used concurrently with arsine, although tBOAs may be used alone.

FIG. 3 shows the FTNMR (Fourier transform nuclear magnetic resonance) spectrum of the tBOAs molecule that is used in the present embodiment. The material of tBOAs is produced from $AsCl_3$ and is available from FURUKAWA Co. Ltd, Tokyo as "tertiary buthyl arsine." From the FTNMR spectrum of FIG. 3 that was obtained based upon the optical resonance for the group containing H, this material was identified to be a mixture of usual tertiary buthyl arsine (tBA; $(CH_3)_3CAsH_2$) and tBOAs.

More specifically, FIG. 3 shows a number of peaks attributed to the $CH_3$ group, $CH_2$ group and the $AsH_2$ group that are pertinent to tBA. In addition, one can observe a slope represented by the broken line at the base part of the peak of the $CH_3$ group. Such a shift occurs in correspondence to the existence of O that is combined with the $CH_3$ group. In other words, the result of FIG. 3 clearly indicates the existence of the buthoxy group ($C_4H_9O$) in the molecule of the material. About the identification of the FTNMR spectrum, see for example A. "YAMAZAKI, Kakujiki-Kyoumei-Bunnkouhou" (Nuclear Magnetic Resonance Spectroscopy), Kyoritsu Publishing KK. Tokyo, 1984 (in Japanese), which is incorporated herein as reference.

Figure 1:
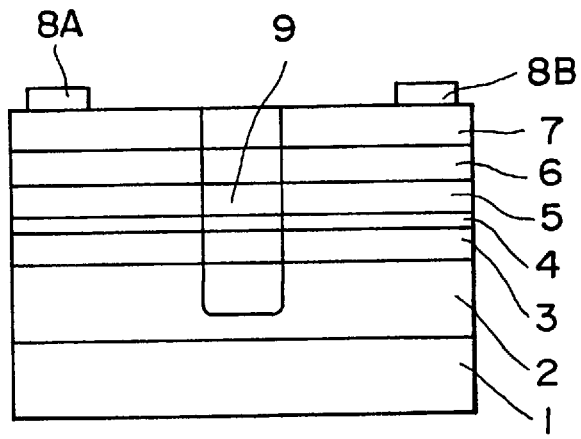
FIG. 1 is a diagram showing the structure of a conventional HEMT integrated circuit that uses a conventional buffer layer and a device isolation structure.
Figure 2:
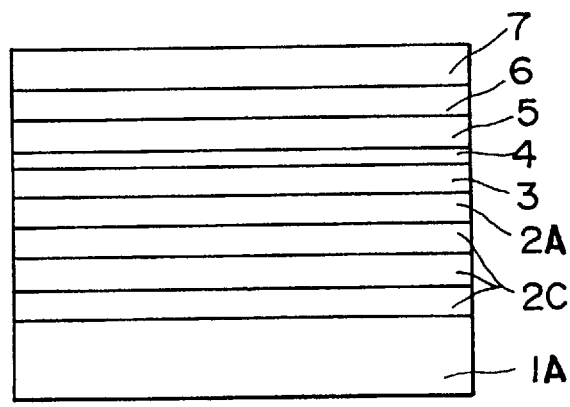
FIG. 2 is a diagram showing the structure of a layered body including a buffer layer used conventionally for fabricating a HEMT integrated circuit.
Figures 4A, 4B, 4C:
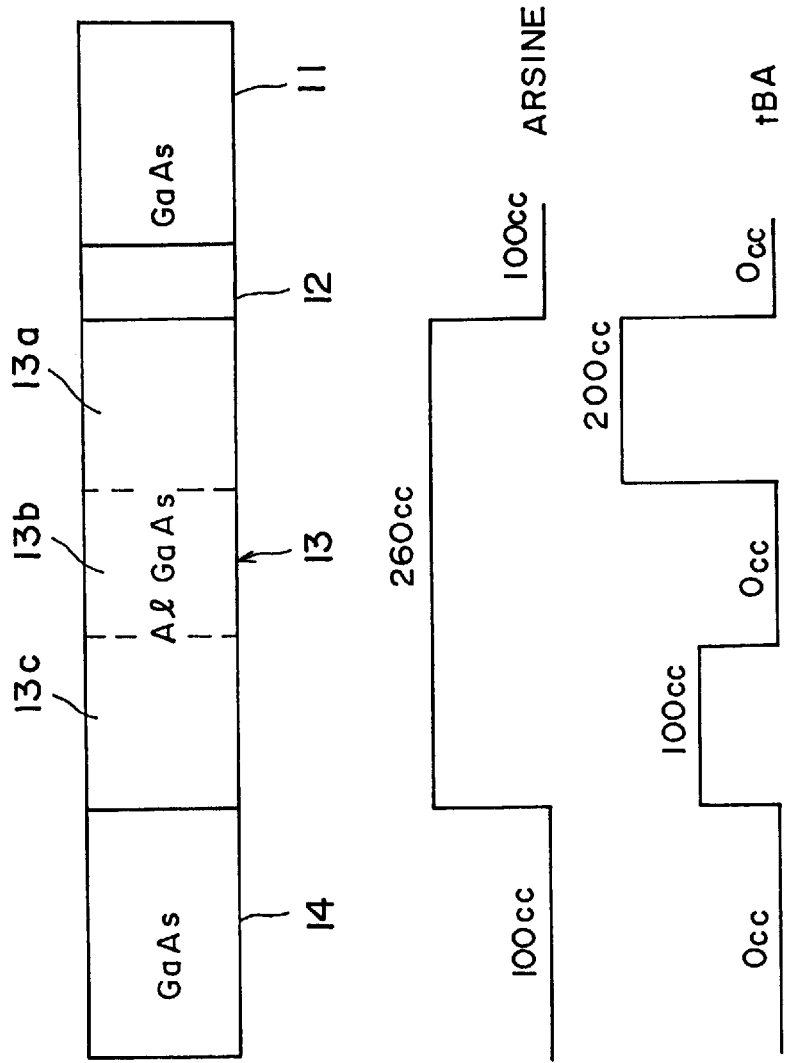
FIG. 4(A)–4(C) are diagrams showing the process for growing an epitaxial structure of group III-V compound semiconductor materials according to a first embodiment of the present invention.

FIGS. 4(A)–4(C) are diagrams showing the process for growing the AlGaAs layer in the present embodiment, wherein FIG. 4(A) shows the epitaxial structure while FIGS. 4(B) and 4(C) show the flowrate profile of arsine and tBOAs used during the growth of the structure of FIG. 4(A).

Referring to FIG. 4(A), the epitaxial growth is made on a GaAs substrate 11 that is held in a reaction vessel (not shown) under the ordinary pressure condition at a temperature of 630° C. First, a GaAs layer 12 is grown on the substrate 11 while flowing arsine alone for the source of As. More specifically, an arsine gas diluted to 18% by a $H_2$ carrier is supplied with a flowrate of 100 cc/minute. Simultaneously, TMG is supplied by bubbling a TMG liquid held at a temperature of –4° C. and a pressure of 59 Torr by a $H_2$ carrier gas with the flowrate of 34.1 cc/min. Thereby, the GaAs layer 12 is grown with a suitable thickness such as 200 nm.

After the GaAs layer 12 is thus formed, the growth of an AlGaAs layer 13 on the GaAs layer 12 is started. In this process, the flow rate of arsine is increased to 260 cc/min and the supply of tBOAs is started simultaneously. The source of tBOAs is a liquid and is held at a temperature of 10° C. and a pressure of 96 Torr. The supply of tBOAs is achieved by bubbling the foregoing liquid source by a hydrogen carrier with the flowrate of 200 cc/min. As already noted, tBOAs contains oxygen in the molecule.

Simultaneously to the supply of arsine and tBOAs, TMG and TMA (trimethyl aluminum) are supplied respectively as the source of Ga and Al. There, the source liquids of TMG and TMA are held at 3° C., 80 Torr and at 18° C., 7.4 Torr respectively, and the vapor of TMG and the vapor of TMA are supplied respectively to the reaction vessel with the flowrates of 16 cc/minute and 12.8 cc/minute by the bubbling the liquid sources by $H_2$. This procedure is continued for about 10 minutes and a first part 13a of the layer 13 is formed with a thickness of about 200 nm. As will be described later with reference to FIG. 5, the layer part 13a thus formed contains substantial amount of oxygen.

Next, in order to examine the reduced contamination of the apparatus by the use of tBOAs, the supply of the tBOAs is shut down for a moment and the growth of the AlGaAs layer 13 is continued under the same condition. Thereby, a second part 13B of the layer 13 is grown with a thickness of about 200 nm. As will be discussed detail in later, such a shut-down of the supply of tBOAs would result in a growth of AlGaAs layer that is substantially free from oxygen when there is no contamination. On the other hand, when there remains substantial amount of oxygen as a result of contamination, the layer part 13B would contain substantial amount of oxygen.

After the second layer part 13B is formed, the supply of tBOAs is resumed with the flow rate of 100 cc/minute and a third layer part 13C is formed on the second layer part 13B with a thickness of about 200 nm. Thereby, the formation of the layer 13 is completed. Further, after the layer 13 is thus formed, the supply of tBOAs is shut down and a GaAs layer 14 is grown on the layer 13 while flowing arsine alone as the source of As with the flowrate of 100 cc/minute. During the growth of the layer 14, TMG is supplied concurrently with the same condition as in the case of growing the GaAs layer 12.

FIG. 5 shows the result of the SIMS (secondary ion mass spectroscopy) analysis conducted on the epitaxial structure obtained according to the foregoing process, wherein the drawing shows the concentration of the elements such as Ga, Al and O along a vertical path extending from the surface of the epitaxial structure toward the substrate 11. FIG. 5 also shows the profile of C and Cl contained in the structure. As the concentration of these elements is not significant, the effect of these elements will not be discussed here.

Referring to FIG. 5, it will be seen that the concentration level of Ga is substantially constant throughout the structure, while the concentration level of Al increases steeply in correspondence to the AlGaAs layer 13. Further, the concentration level of O changes in correspondence to the layer parts 13A, 13B and 13C such that the concentration level exceeds far above $10^{19}$ cm$^{-3}$ in the layer parts 13A or 13C. In fact, the concentration level of O exceeds $4 \times 10^{19}$ cm$^{-3}$ in the layer part 13C, while the concentration level reaches almost $10^{20}$ cm$^{-3}$ in the layer part 13A. Thereby, the layers 13A and 13C show a high resistivity associated with the existence of the deep impurity level of oxygen. Oxygen thus observed is believed to be incorporated into the crystal structure of AlGaAs and exist in the form of oxygen ions.

In FIG. 5, it should be noted that the concentration level of oxygen in the layer part 13B remains well below $10^{19}$ cm$^{-3}$. More specifically, the oxygen concentration level of the part 13B is about $3 \times 10^{18}$ cm$^{-3}$ that is about one tenth the oxygen concentration level in the layer part 13C. Further, it should be noted that the concentration level of oxygen in the GaAs layer 14 that is grown on the oxygen-containing AlGaAs layer 13c is substantially the same as the oxygen concentration level of the GaAs layer 12 which was formed prior to the growth of the layer 13.

The result of FIG. 5 clearly indicates that the contamination of oxygen is not significant when oxygen is introduced in the form of gaseous organic molecule of As such as tBOAs. This also indicates that molecules of tBOAs are stable during the transportation to the reaction vessel and oxygen does not contaminate the piping system or the wall of the reaction chamber. Another remarkable feature of the present embodiment is that the layers 13a and 13c contain oxygen with an amount that is much larger than the conventional epitaxial layer formed from the organic source such as trimethoxy gallium or trimethoxy aluminum. This increased oxygen content is the result of increased flowrate of tBOAs as compared with trimethoxy gallium or trimethoxy aluminum.

Figure 6:
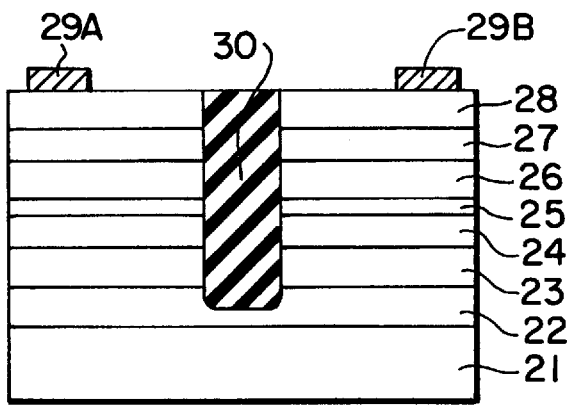
FIG. 6 is a diagram showing the structure of a HEMT that is formed on the epitaxial structure produced by the first embodiment process of the present invention.

FIG. 6 shows the structure of a HEMT formed on an epitaxial structure that includes the foregoing oxygen-containing AlGaAs buffer layer.

Referring to FIG. 6, the device is constructed on a GaAs substrate 21, and a first buffer layer 22 of GaAs corresponding to the layer 12 of FIG. 4(A) is grown on the substrate 21. Further, a second buffer layer 23 corresponding to the buffer layer 13 of FIG. 4(A) is grown on the first buffer layer 22. On the second buffer layer, a channel layer 24 of GaAs, a spacer layer 25 of undoped AlGaAs, an electron supplying layer 26 of n-type AlGaAs, a cap layer 27 of n-type GaAs, and another cap layer 28 that actually consists of a layered body of n-type GaAs and n-type AlGaAs are provided as usual. Further, gate electrodes 29A and 29B are provided on the layer 28 in correspondence to respective device regions, and a device isolation region 30 is formed between the adjacent device regions by an ion implantation of oxygen such that the region 30 reaches the buffer layer 22.

In such a device structure, the devices are isolated laterally by the device isolation region 30. Further, the penetration of carriers as well as the penetration of the electric field through the barrier layer is effectively prevented by the buffer layer 23 that incorporates therein fixed electric charges in the form of oxygen ions. As already noted, such oxygen ions not only cause the pinning of the Fermi level but also act as a shield of the electric field.

Next, the effect of the device isolation achieved by the buffer layer thus formed by the present invention will be described in detail with reference to FIGS. 7 and 8 that show a second embodiment of the present invention.

Figure 7:
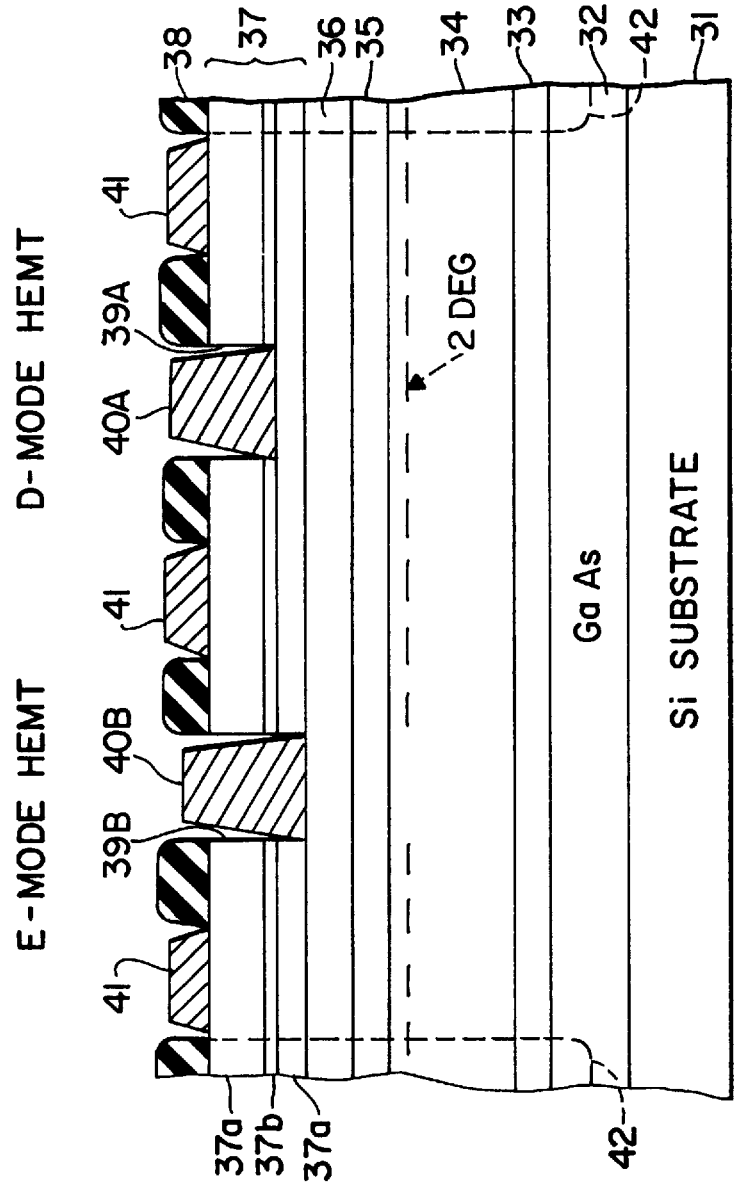
FIG. 7 is a diagram showing the structure of another HEMT according to a second embodiment of the present invention.

FIG. 7 shows a part of a HEMT integrated circuit that includes a number of device regions each of which includes an E-mode HEMT and a D-mode HEMT. In the present embodiment, the integrated circuit is constructed on a silicon substrate 31.

On the upper major surface of the silicon substrate 31, there is provided a first buffer layer 32 of undoped GaAs with a thickness of 3 µm. As is commonly practiced in the art, the GaAs buffer layer 32 is grown on the silicon substrate 31 as an amorphous phase and crystallized subsequently upon subsequent deposition of crystal layers thereon.

On the upper major surface of the buffer layer 32, a second buffer layer 33 corresponding to the buffer layer 13 is provided with a thickness of 600 nm. The buffer layer 33 is grown by using tBOAs under the condition that is the same as the condition used for growing the layer 13a of FIG. 4(A). Further, a channel layer 34 of undoped GaAs is provided on the buffer layer 33 with a thickness of about 300 nm, and an electron supplying layer 36 of n-type AlGaAs is provided on the channel layer 34 with a thickness of about 37 nm, with a spacer layer 35 of undoped AlGaAs interposed between the layers 34 and 36 with a thickness of 1 nm as usual. On the electron supplying layer 36, a processing layer 37 that in turn includes an alternate deposition of an n-type GaAs layer 37a and an n-type AlGaAs layer 37b, is provided with a total thickness of about 100 nm. On the processing layer 37, an insulation layer 38 of silicon oxide is provided.

Further, grooves 39A and 39B are formed on the processing layer 37 respectively in correspondence to the E-mode HEMT and the D-mode HEMT such that the groove 39A for the E-mode HEMT exposes the upper major surface of the GaAs layer 37a that is grown immediately above the electron supplying layer 36, and a Schottky electrode 40A is provided in contact with the exposed upper major surface of the layer 37a as a gate of the E-mode HEMT with a gate length of 0.5 µm. The groove 39B on the other hand is provided to extend through the entire thickness of the layer 37 and exposes the upper major surface of the electron supplying layer 36. Further, another Schottky electrode 40B is provided in correspondence to the groove 39B on the exposed upper major surface of the layer 36 as a gate of the D-mode HEMT with a gate length of 0.5 μm. Further, the silicon oxide layer 38 is patterned in correspondence to the source and drain of the device to expose the upper major surface of the layer 37, and ohmic electrodes 41 are provided on the exposed surface of the layer 37 as the source and drain electrodes of the HEMT. After the individual devices are formed as such, an ion implantation process of oxygen is conducted to form a device isolation region 42 in correspondence to the boundary between adjacent device regions such that the device isolation region 42 reaches the buffer layer 32, and the fabrication of the HEMT integrated circuit is completed.

Figure 8:
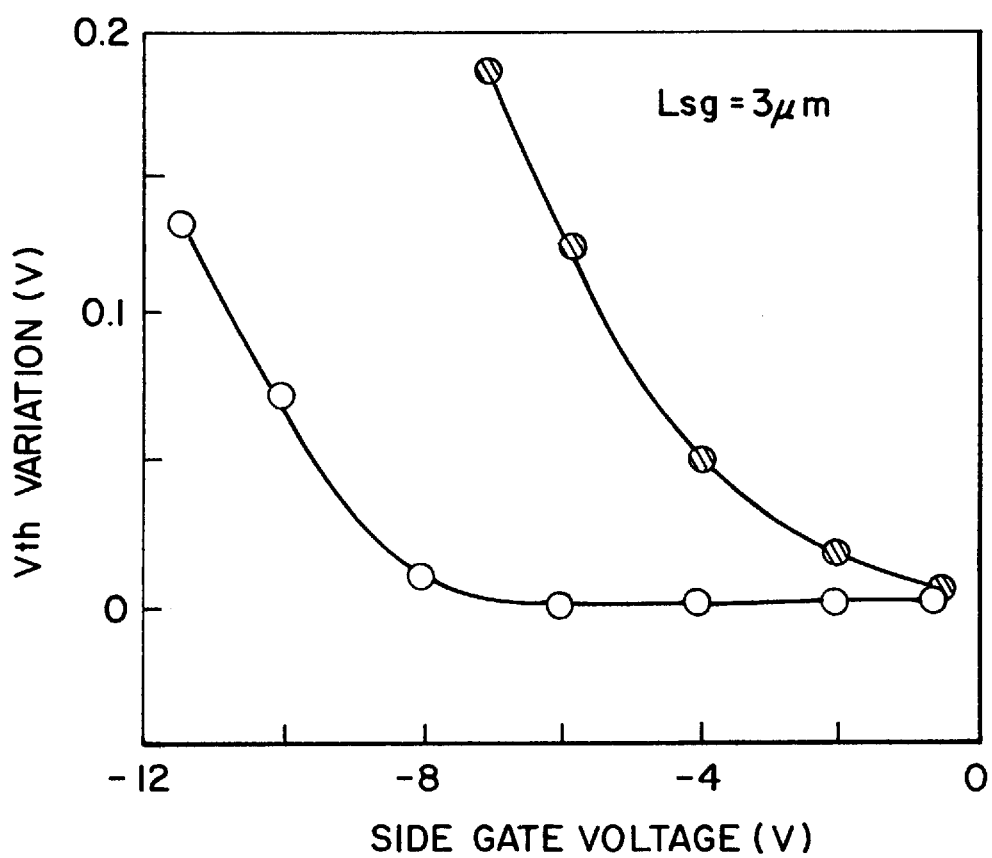
FIG. 8 is a diagram showing the suppression of the side gate effect that is achieved in the device of the second embodiment in comparison with a conventional device.

FIG. 8 shows the shift of the threshold voltage $V_{TH}$ of the D-mode HEMT of FIG. 7 in response to the application of a side gate voltage to another D-mode HEMT in the adjacent device region. In FIG. 8, the result for the device of FIG. 7 is represented by the open circles. In this measurement, the gates of the devices were separated from each other by a distance of 3 μm ($L_{sg}$=3 μm) across the device isolation region 42, and no voltage was applied to the gates of the E-mode HEMTs. For the sake of comparison, the result of similar measurement for the HEMT integrated circuit that has an identical structure except for the buffer layer 33 is represented by the solid circles.

As can be seen clearly from FIG. 8, the device of the present embodiment can suppress the side gate effect even when a side gate voltage as large as −8 volts is applied to the adjacent device. On the other hand, the conventional device shows a conspicuous side gate effect even when the side gate voltage of −1 volt is applied. The device thus constructed showed the K factor of 293 mA/V/mm² and the transconductance $g_m$ of 241 mS/mm.

Figure 9:
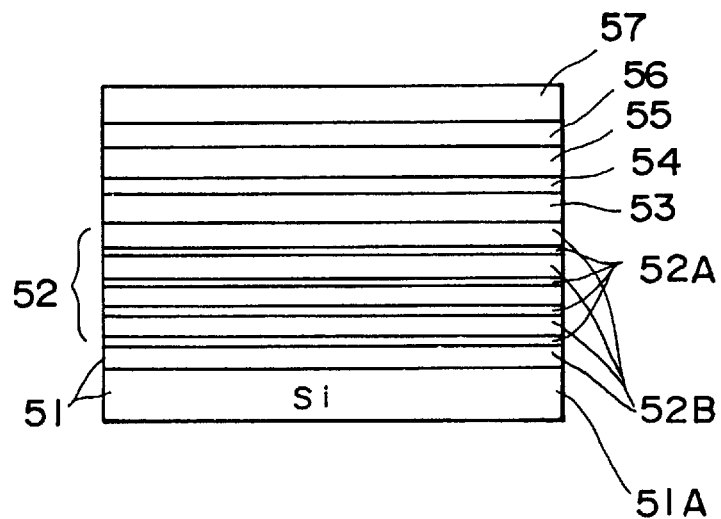
FIG. 9 is a diagram showing an epitaxial structure produced according to a third embodiment of the present invention.

FIG. 9 shows a third embodiment for growing a buffer layer containing fixed electric charges on a silicon substrate 51. It should be noted that the silicon substrate 51 includes a strained superlattice structure 51b formed on the upper major surface a silicon substrate 51a for facilitating the growth of compound semiconductor layer.

Referring to FIG. 9, a first buffer layer 52a of oxygen-containing AlGaAs is provided on the (100) oriented surface of the superlattice layer 51b with a thickness of 20 nm, and a second buffer layer 52b of high purity AlGaAs is grown on the first buffer layer 52a with a thickness of about 200 nm. Such an alternate growth of the first and second buffer layers 52a and 52b are repeated for example for three times.

In growing the buffer layers 52a and 52b, tBOAs is used together with arsine for the source of the layer 52a similarly to the first embodiment. When growing the layers 52a and 52b alternately, a thermal cycling process is employed for relaxing the stress that is accumulated in these layers due to the large difference in the lattice constant and thermal expansion between AlGaAs and silicon.

Figure 10:
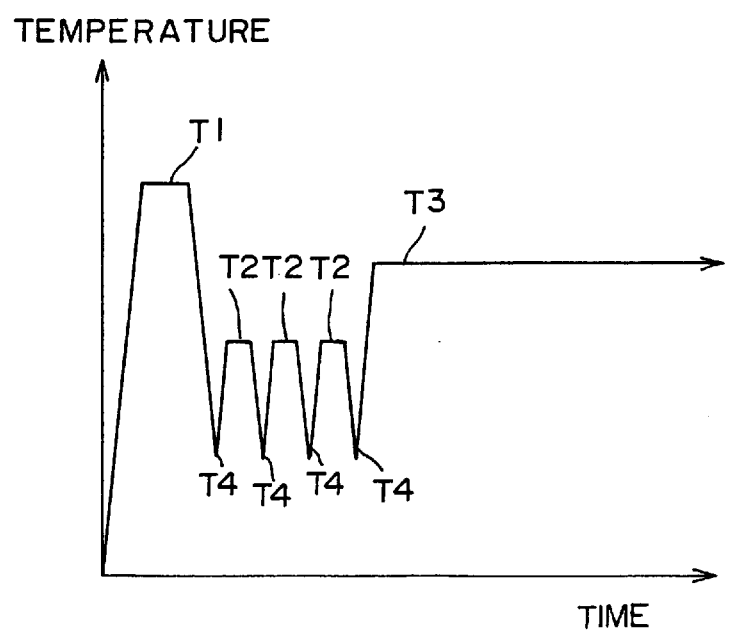
FIG. 10 is a diagram showing the fabrication process of the structure of FIG. 9.

FIG. 10 shows the thermal cycling process that is conducted in a single reaction vessel for the growth of the epitaxial layers 52–57. Referring to FIG. 10, the substrate 51 includes therein the silicon substrate 51a and the strained superlattice layer 51b, and is baked at a high temperature $T_1$ such as 1000° C. at the beginning of the epitaxial process to remove any oxide film or contamination from the surface of the layer 51b. Next, the temperature is lowered to a temperature $T_4$ such as 300° C. and raised again to a temperature $T_2$ that is set to about 600° C. At this temperature, the buffer layers 52a and 52b at the first level are grown consecutively.

Next, the temperature is lowered to $T_4$ and raised again to $T_2$, and the growth of the layers 52a and 52b for the second level is achieved. Further, the temperature is lowered to $T_4$ and raised again to $T_2$ and the growth of the layers 52a and 52b for the third level is achieved. It should be noted that the foregoing thermal cycling is achieved in the same reaction vessel, without taking the substrate therefrom.

By applying the foregoing thermal cycling process, the stress in the layers 52a and 52b is relaxed as already noted, and such a relaxation of the stress results in an improved surface roughness of the buffer layer 52 as well as the reduced defect concentration level in the layers grown on the layer 52. After the buffer layer 52 is formed, a channel layer 53 corresponding to the channel layer 34 of FIG. 7, a spacer layer 54 corresponding to the spacer layer 35, an electron supplying layer 55 corresponding to the electron supplying layer 35, and a cap layer 57 corresponding to the cap layer 37, are grown consecutively according to the usual process.

In the present embodiment, the barrier structure 52 contains the fixed electric charges therein and can block the carriers that are released from various surface states and impurity states formed on the exposed surface of the substrate 51. Therefore, the operation of the semiconductor devices formed in the epitaxial layers 53–57 is substantially stabilized. In other words, the influence of the free surface of the substrate on the device performance can be minimized by providing the buffer layer 52 on the free surface of the substrate 51.

It should be noted that the above principle can be applicable also for the fabrication process of semiconductor devices that includes an interruption of the crystal growth. When the crystal growth is interrupted, for example for the purpose of photolithographic process and the like, the formation of adversary surface states is generally inevitable. By growing the buffer layer containing oxygen ions in the crystal when resuming the epitaxial process, the effect of the surface states can be effectively shielded.

It should be noted that the foregoing alternate and repetitive growth of the oxygen-containing AlGaAs buffer layer 52a and the high purity AlGaAs buffer layer 52b improves the surface morphology or surface roughness of the buffer layer 52 and hence the quality of the channel layer 53 that is grown directly on the layer 52. Without such an alternate and repetitive deposition of the high purity layer and the doped layer, there is a tendency that the surface morphology becomes rough with increasing dose of the dopant. It is believed that such a degradation of the surface morphology is caused by the stress induced in the epitaxial layer by the dopant.

The foregoing alternate stacking of the oxygen-containing AlGaAs buffer layer 52a and the high purity AlGaAs buffer layer 52b successfully eliminates the problem of degradation of the surface morphology. In one example, a measurement of the surface roughness was made for an epitaxial structure that is essentially identical with the structure of FIG. 9.

In this experiment, a buffer layer corresponding to the layer 52 was formed on a semi-insulating GaAs substrate corresponding to the substrate 51 of FIG. 7 by an alternate repetition of a high purity GaAs layer and an oxygen-containing AlGaAs layer with the total thickness of the GaAs layer of 20 nm and the total thickness of the AlGaAs layer of about 30 nm. The deposition of the GaAs and AlGaAs buffer layers was repeated three times, five times or eight times, wherein the deposition of the oxygen-containing AlGaAs layer was made under the condition similar to the first embodiment. On the buffer layer thus formed, another buffer layer of undoped GaAs was grown with a thickness of 20 nm, and a channel layer of undoped InGaAs having a composition of $In_{0.2}Ga_{0.8}As$ was grown thereon in correspondence to the channel layer 53 of FIG. 9.

On the channel layer thus formed, a spacer layer of undoped InGaP is grown with a thickness of 2 nm in correspondence to the layer 54 and an electron supplying layer of n-type InGaP is grown on the spacer layer in correspondence to the layer 55 with a thickness of 40 nm. Further, a cap layer of n-type GaAs is grown on the electron supplying layer thus grown with a thickness of 30 nm.

As a result of the measurement of the surface roughness that uses the interference of laser beam, it was found that the surface roughness of the epitaxial structure thus obtained was as small as 1.2 nm. This indicates that the surface of the buffer layer in the epitaxial structure is excellent and the quality of the channel layer formed thereon is also excellent.

Figure 11A:
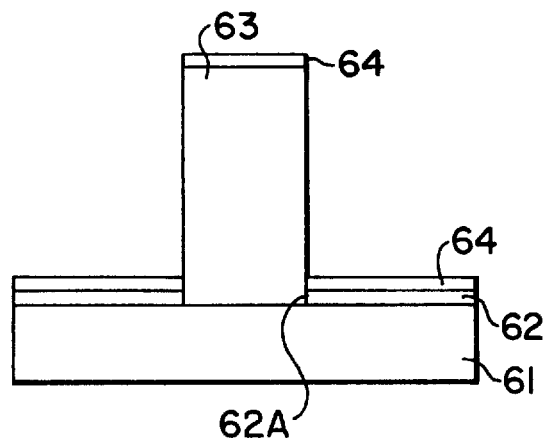
FIGS. 11(A) and 11(B) are diagrams showing a HEMT and a fabrication process thereof according to a fourth embodiment of the present invention.
Figure 11B:
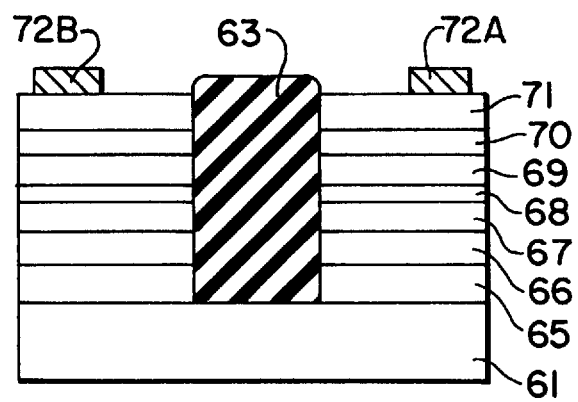

Next, a fourth embodiment of the present invention will be described with reference to FIGS. 11(A) and 11(B), wherein FIG. 11(A) shows an intermediate step of device fabrication process and FIG. 11(B) shows the structure of the device of the present embodiment.

Referring to FIG. 11(A), a SiON layer 62 is deposited on a GaAs substrate 61 and patterned to form a window 62a that exposes the upper major surface of the substrate 61. Further, by using the patterned SiON layer 62 as a mask, a layer of oxygen-containing AlGaAs layer 63 is grown selectively on the part of the substrate 61 that is exposed by the window 62a. Further, a silicon oxide layer 64 is grown on the entire upper surface of the structure thus formed. Thus, the structure shown in FIG. 11(A) is obtained.

Next, the SiON layer 62 is dissolved in an organic solvent. Further, the silicon oxide layer 64 that covers the SiON layer 62 is removed altogether, and the upper major surface of the GaAs substrate 61 is exposed at both lateral sides of the layer 63 that projects upward from the substrate 61. Further, a GaAs buffer layer 65 corresponding to the buffer layer 22 of FIG. 6 is grown on the exposed upper major surface of the substrate 61 and a second buffer layer 66 of oxygen-containing AlGaAs is grown on the first buffer layer 66 in correspondence to the buffer layer 23 of FIG. 6. During this process, no epitaxial growth is made on the layer 63, as the top surface of the layer 63 is protected by the silicon oxide layer 64 that rejects the growth of III-V compound semiconductor material thereon.

On the buffer layer 66 thus formed, a channel layer 67 of undoped GaAs, a spacer layer 68 of undoped AlGaAs, an electron supplying layer 69 of n-type AlGaAs, a cap layer 70 of n-type GaAs, and another cap layer 71 of n-type AlGaAs and n-type GaAs are grown respectively in correspondence to the layers 24, 25, 26, 27 and 28 of FIG. 6. Further, Schottky electrodes 72A and 72B are provided on the upper major surface of the second cap layer 71 as a gate electrode. Thus, a device that includes a pair of HEMTs is obtained such that the HEMTs are isolated with each other laterally by the layer 63 of oxygen-containing AlGaAs and vertically by the buffer layer 66 also of oxygen-containing AlGaAs. In other words, the present embodiment provides a process for forming the device isolation region without relying upon the ion implantation of oxygen.

Next, a fifth embodiment of the present invention will be described with reference to FIGS. 12(A)–12(D). In the present embodiment, a region that forms the active part of the device is grown on a substrate laterally at a selected location.

Figure 12A:
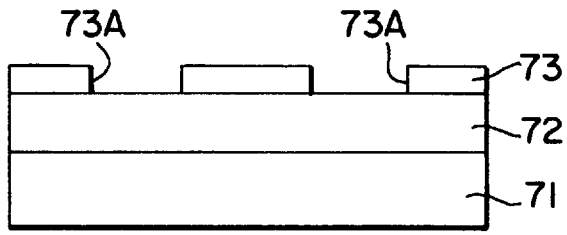
FIGS. 12(A)–12(D) are diagrams showing the fabrication process of a semiconductor structure according to a fifth embodiment of the present invention.

Referring to FIG. 12(A) first, an epitaxial layer 72 of undoped AlGaAs is grown epitaxially on a GaAs substrate 71, and a SiON layer 73 is deposited on the AlGaAs layer 72. Further, the layer 73 is patterned to form windows 73a that expose the upper major surface of the AlGaAs layer 72 in correspondence to where a selective epitaxial growth of a III-V material is to be made. For example, the windows 73a may expose a strip-like region extending in the <010> direction of AlGaAs layer 72.

Figure 12B:
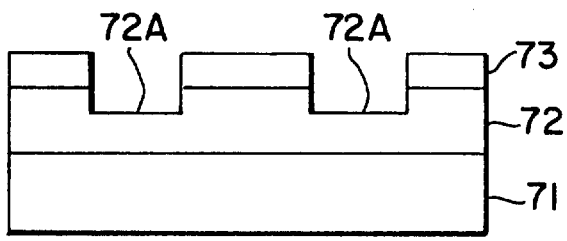

In the step of FIG. 12(B), the AlGaAs layer 72 is subjected to an RIE process while using the SION layer 73 as a mask, and a plurality of grooves 72a are formed in correspondence to the device region such that the grooves 72a extend in the <010> direction.

Figure 12C:
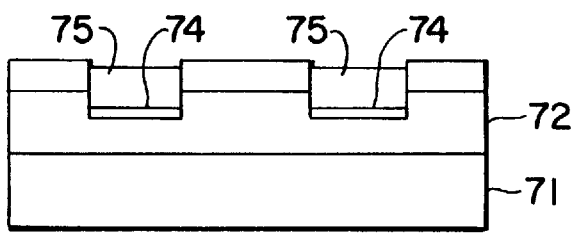
Figure 12D:
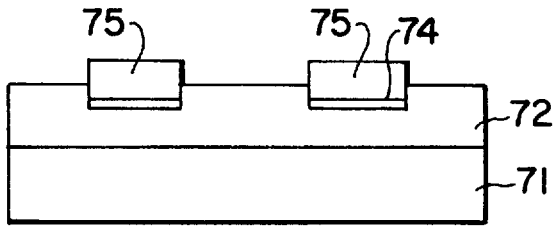

Further, in the step of FIG. 12(C), an oxygen-containing AlGaAs layer 74 is grown on the AlGaAs layer 72 in correspondence to the grooves 72a according to the process described with the first embodiment for growing the layer 13a, and an undoped GaAs layer 75 is grown on the layer 74 in correspondence to the grooves 72a such that the grooves 72a is filled by the GaAs layer 75. Further, the SiON mask layer 73 is removed and a structure shown in FIG. 12(D) is obtained. It should be noted that the GaAs layer 75 having a laterally confined width in the AlGaAs layer 72 forms a quantum well wire or box when the lateral width of the layer 75 is reduced.

Figure 13A:
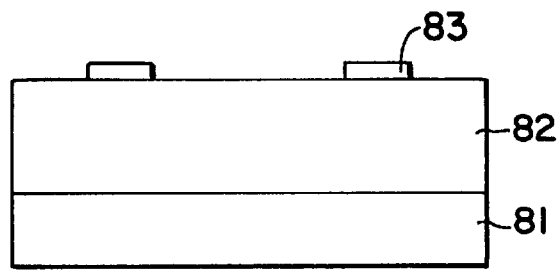
FIGS. 13(A)–13(C) are diagrams showing the fabrication process of a semiconductor structure according to a sixth embodiment of the present invention.
Figure 13B:
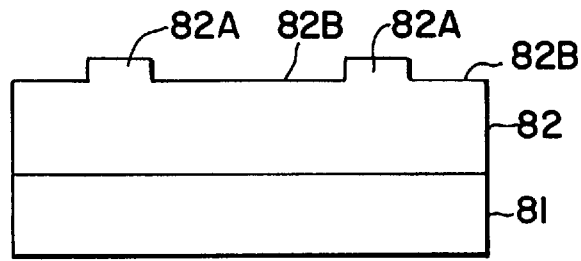
Figure 13C:
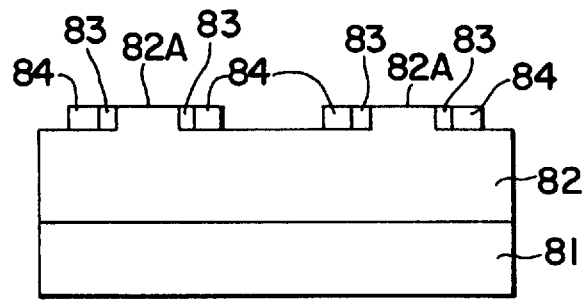

FIGS. 13(A)–13(C) show a sixth embodiment of the present invention. This embodiment is also suitable for forming a quantum well wire or a quantum well box.

Referring to FIG. 13(A), an undoped AlGaAs layer 82 is grown on a semi-insulating GaAs substrate 81 and a mask layer 83 of SiON is grown on the layer 82. The mask layer 83 is patterned subsequently to form a number of strip-like patterns extending parallel with each other on the surface of the AlGaAs layer 82 in the horizontal direction.

In the step of FIG. 13(B), the surface of the layer 82 is subjected to an RIE process to form a number of grooves 82b separated with each other by projections 82a, wherein the projections 82a correspond to the mask 83 and the grooves 82b correspond to the exposed part of the surface of the layer 82.

In the step of FIG. 13(C), an oxygen-containing AlGaAs layer 82 is grown laterally along the surface of the grooves 82b such that the growth of the layer 83 starts from the step of the projections 82a, wherein the growth of the layer 83 may be achieved similarly to the growth of the layer 83 of the first embodiment. After the layer 83 is formed as such, the growth of an undoped GaAs layer 84 is achieved also along the surface of the grooves 82b, starting from the step of the layer 83. In this embodiment, a quantum well wire having a reduced width may be easily formed.

In the foregoing description, the growth of the oxygen-containing AlGaAs layer has been achieved by using tBOAs for the source of O and As. However, the source of O and As that can be used in the process of the present invention is not limited to tBOAs but other organic sources of As can also be used. These organic sources include: monoethoxy arsine $(C_2H_5OAsH_2)$; monophenoxy arsine $(C_6H_5OAsH_2)$; monomethoxy arsine $(CH_3OAsH_2)$; ditertiary buthoxy arsine $((C_4H_9O)_2AsH)$; diethoxy arsine $((C_2H_5O)_2AsH)$; diphenoxy arsine $((C_6H_5O)_2AsH)$; dimethoxy arsine $((CH_3O)_2AsH)$; tritertiary buthoxy arsine $((C_4H_9O)_3As)$; triethoxy arsine $((C_2H_5O)_3As)$; triphenoxy arsine $((C_6H_5O)_3As)$; and trimethoxy arsine $((CH_3O)_3As)$.

According to the present invention, one can introduce oxygen into a reaction vessel without causing a contamination. As oxygen is supplied in the form of organic molecules of the source gas of the group V element and as the source gas of the group V element is supplied with much larger amount as compared with the source gas of the group III element, a large amount of oxygen ions can be incorporated into the reaction vessel and hence into the epitaxial layer. By using such an epitaxial layer that contains large amount of oxygen ions as the impurity for the buffer layer, one can achieve an effective device isolation.

Next, a seventh embodiment of the present invention will be described with reference to FIG. 14 showing the structure of a HEMT.

Referring to FIG. 14, the HEMT has a standard structure and is constructed on a semi-insulating GaAs substrate 91 and includes a buffer layer 92 of AlGaAs of which deposition condition and material characterization will be described in detail later, wherein the buffer layer 92 is grown epitaxially on the GaAs substrate 91 with a thickness of about 300 nm. The buffer layer 92 has a composition represented as $Al_xGa_{1-x}As$, wherein the compositional parameter x is typically set equal to 0.2 or more.

On the buffer layer 92, there is provided another buffer 93 of undoped GaAs with a thickness of about 20 nm, and an active layer 94 of undoped InGaAs having a composition of $In_{0.2}Ga_{0.8}As$ is grown epitaxially on the buffer layer 93 with a thickness of about 150 nm. Further, there is provided a spacer layer 95 of undoped InGaP epitaxially on the active layer 94 with a thickness of about 1 nm, and an electron supplying layer 96 of n-type InGaP is provided on the spacer layer 95 with a thickness of about 30 nm. The electron supplying layer 96 is doped with an impurity concentration level of $2\times10^{18}$ cm$^{-3}$, and injects electrons to the two-dimensional electron gas formed in the active layer 94 in correspondence to the interface to the spacer layer 95, as usual.

On the electron supplying layer 96, there is provided a Schottky electrode 99 of Al or WSi acting as a gate electrode of the device in correspondence to the channel region of the device, and contact layers 97a and 97b of n-type GaAs are provided on the electron supplying layer in correspondence to both sides of the gate electrode 99. The contact layers 97a and 97b are provided with a thickness of about 30 nm, and source and drain electrodes 98a and 98b are provided respectively on the contact layers 97a and 97b in ohmic contact therewith.

In the present embodiment, the deposition of the buffer layer 92 is achieved by the MOCVD process by using the organic source of As containing oxygen in the molecule in addition to arsine, similarly to the previous embodiments. Hereinafter, the experiments conducted for depositing an epitaxial layer of AlGaAs acting as the buffer layer 93 will be described.

In the experiments, the AlGaAs layer was deposited by supplying TMA and TEG (triethylgallium) as the source of Al and Ga together with arsine and tBOAs that are supplied as the source of As, wherein the composition of the AlGaAs layer was set to $Al_{0.2}Ga_{0.8}As$.

TABLE I below shows the relationship between the deposition condition and the concentration level of oxygen and carbon in the AlGaAs layer thus obtained, wherein the deposition condition is represented in terms of the substrate temperature and the proportion of tBOAs in the gaseous source of As supplied for deposition. As the gaseous source of As includes arsine in addition to tBOAs, the listed value of the tBOAs is given according to the relationship of [tBOAs %]=[tBOAs flowrate]/{[tBOAs flowrate]+[arsine flowrate]}×100. The oxygen concentration and carbon concentration were obtained by the SIMS analysis.

TABLE I

| T (°C.) | tBOAs % | oxygen cm$^{-3}$ | carbon cm$^{-3}$ | RUN |
|---|---|---|---|---|
| 580 | 0 | $3 \times 10^{18}$ | $7 \times 10^{16}$ | S120 |
| 580 | 25 | $6 \times 10^{19}$ | $7 \times 10^{17}$ | S116 |
| 580 | 100 | $2 \times 10^{20}$ | $7 \times 10^{17}$ |  |
| 660 | 0 | $8 \times 10^{17}$ | $2 \times 10^{16}$ | S113 |
| 660 | 25 | $6 \times 10^{19}$ | $2 \times 10^{17}$ | S111 |

The foregoing relationship of TABLE I indicates that oxygen is incorporated into AlGaAs even when there is no oxygen dopant (tBOAs) supplied in the source of As, while the concentration level of such "intrinsic" oxygen changes with the temperature of the deposition. With increasing temperature from 580° C. to 660° C., the oxygen content in the AlGaAs decreases from $3\times10^{18}$ cm$^{-3}$ to $8\times10^{17}$ cm$^{-3}$. On the other hand, once the oxygen dopant is supplied externally with a proportion exceeding 25%, the oxygen content in the AlGaAs layer assumes a constant level such as $6\times10^{19}$ cm$^{-3}$ irrespective of the temperature, provided that the proportion of the oxygen dopant is set the same. Compare the run #S116 and the run #S111. This indicates that the incorporation of a large amount of oxygen as a result of the doping obscures the temperature dependence of the "intrinsic" oxygen. The foregoing relationship also indicates that one can control the oxygen content in the AlGaAs layer primarily by controlling the proportion of the oxygen dopant in the gaseous source of As. In other words, TABLE I indicates that one can compensate for the depletion of intrinsic oxygen in AlGaAs that occurs at elevated temperatures by employing the oxygen doping, and that the oxygen content in the AlGaAs layer primarily reflects the proportion of the oxygen dopant in the gaseous source of As.

Another remarkable point in TABLE I is that there occurs an incorporation of carbon in AlGaAs simultaneously to the incorporation of oxygen in the foregoing MOCVD process and that the carbon content changes heavily with the temperature of deposition. Further, the carbon content in AlGaAs for a given temperature shows a tendency of saturation once the oxygen content in AlGaAs has exceeded a certain level between 0% and 25%. This in turn indicates that the carbon content in AlGaAs reflects primarily the temperature of deposition. In view of the fact that the oxygen content in the AlGaAs layer primarily reflects the proportion of the oxygen dopant, the foregoing result of carbon concentration indicates that one can control the oxygen content and the carbon content more or less independently by controlling the proportion of the oxygen dopant and the deposition temperature. Conversely, one can deduce the deposition condition of the AlGaAs layer by detecting the oxygen content and the carbon content.

Figure 15A:
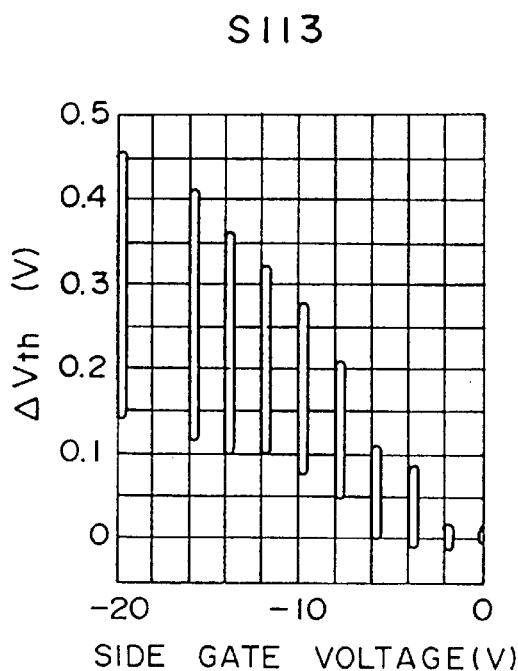
FIGS. 15(A)–15(D) are diagrams showing the side gate effect observed for various specimens of the HEMT of FIG. 14 wherein the deposition condition of the buffer layer is changed variously.
Figure 15B:
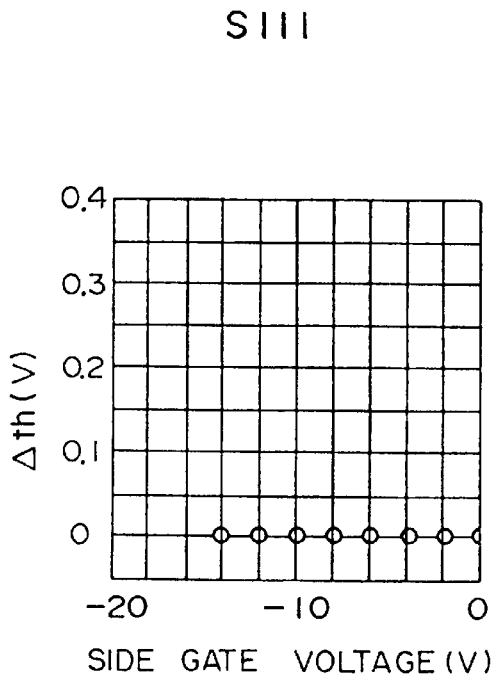
Figure 15C:
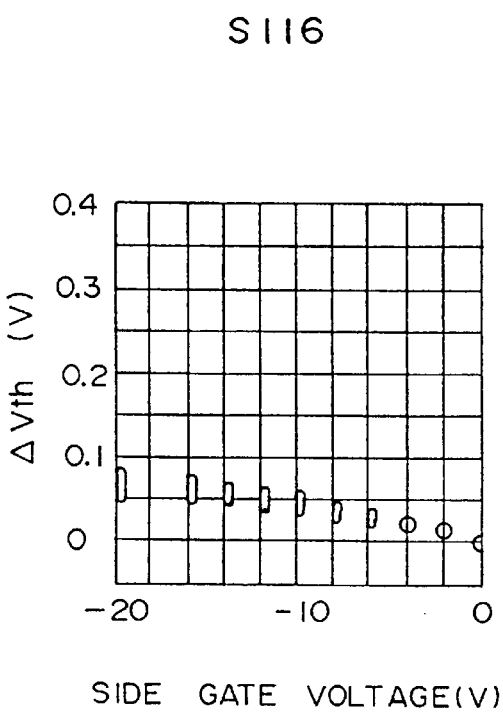
Figure 15D:
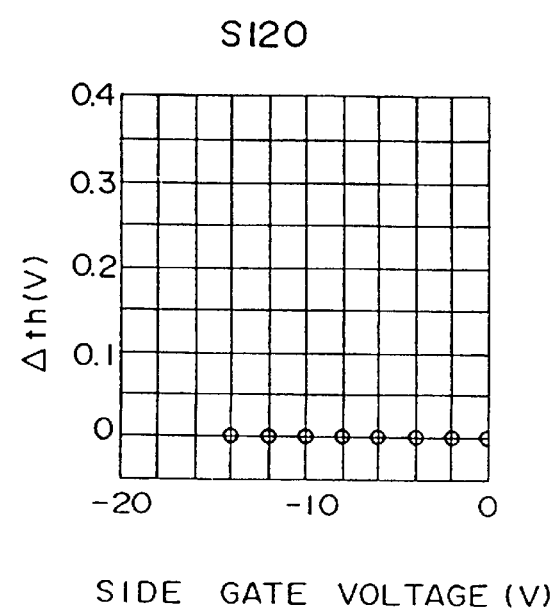

FIGS. 15(A)–15(D) show the side gate effect observed for the HEMT of FIG. 14. More specifically, FIGS. 15(A)–15 (D) show the variation of the threshold voltage upon application of a side gate voltage to an adjacent device. In the measurement, a number of HEMTs are formed on a same, common substrate together with the device isolation region which is similar to the region 42 of FIG. 7, with a mutual distance of 2 μm ($L_{sg}$=3 μm). It should be noted that FIG. 15(A) shows the case wherein the buffer layer 92 is formed according to the process for the run #S113 of TABLE I, FIG. 15(B) shows the case wherein the buffer layer 92 is formed according to the process for the run #S111, FIG. 15(C) shows the case wherein the buffer layer 92 is formed according to the process for the run #S116 of TABLE I, and FIG. 15(D) shows the case wherein the buffer layer 92 is formed according to the process for the run #S120 of TABLE I. It will be noted that there exists an extensive side gate effect in the device of FIG. 15(A) that contains oxygen in the buffer layer 92 with a concentration level of $8\times10^{17}$ cm$^{-3}$, while the side gate effect is completely eliminated in the device of FIG. 15(B). In the device of FIG. 15(B), the buffer layer 92 contains oxygen with a concentration level of $6\times10^{19}$ cm$^{-3}$. Further, the side gate effect is substantially reduced in the device of FIG. 15(C) although not eliminated completely. Further, the device that corresponds to the run #S120 in TABLE I, made at the temperature of 580° C. without oxygen dopant, shows an effective elimination of the side gate effect in correspondence to the oxygen concentration level of $3\times10^{18}$ cm$^{-3}$ as indicated in FIG. 15(D). This indicates that one has to incorporate oxygen in the buffer layer 92 with a concentration level above a level located somewhere between $8\times10^{17}$ cm$^{-3}$ for the run #S113 and $3\times10^{18}$ cm$^{-3}$ for the run #S120.

The foregoing result of FIGS. 15(A)–15(D) indicates further that the side gate effect is suppressed effectively when the buffer layer of a HEMT is grown at a low temperature such as 580° C. without supplying oxygen dopant as demonstrated by the run #S120. When oxygen dopant is supplied at the temperature of 580° C., on the other hand, there appears a slight side gate effect as indicated in FIG. 15(C) in correspondence to the run #S116. In this regard, one has to note that the carbon content in the AlGaAs buffer layer 92 increases in the run #S116 as compared with the run #S111. As carbon acts as a shallow donor of holes, it is believed that the holes released by carbon neutralizes some of the electric charges that are created by the deep oxygen donor in the AlGaAs crystal as the trap of the line of electric forces, and that such a neutralization appears in FIG. 15(C) in the form of the residual side gate effect. In order to eliminate the side gate effect completely, it is therefore necessary to suppress the concentration level of carbon in the AlGaAs buffer layer 92 below the concentration level of the electric charges. The run #S111 satisfies this condition.

Anyway, it is desirable to grow the buffer layer 92 such that the buffer layer 92 contains substantial amount of oxygen in the concentration level exceeding $1\times10^{18}$ cm$^{-3}$ that corresponds to an intermediate value between the run #S120 and the run #S113 and such that the buffer layer 92 contains carbon in the concentration level below $5\times10^{17}$ cm$^{-3}$, in which the carbon concentration level of $5\times10^{17}$ cm$^{-3}$ corresponds to an intermediate value between the run #S116 and the run #S111. In order to achieve the foregoing concentration level of oxygen in the buffer layer 92, it is desired to add oxygen dopant such as tBOAs to the source of arsenic. Particularly, such a procedure is necessary in the run #S113 wherein the concentration level of the "intrinsic" oxygen decreases below the foregoing required concentration level because of the elevated deposition temperature.

On the other hand, it is noted that the HEMT that contains oxygen in the buffer layer 92 tends to show a hysteresis loop in the operational characteristics depending upon the growth condition of the buffer layer 92.

Figure 16A:
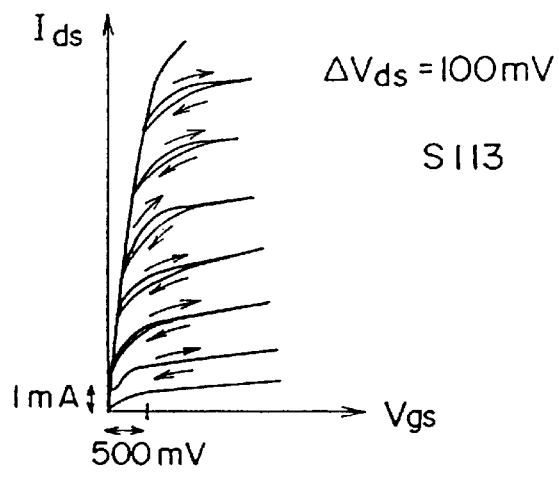
FIGS. 16(A)–16(D) are diagrams showing the characteristic curve observed for various specimens of the HEMT of FIG. 14 wherein the deposition condition of the buffer layer is changed variously.
Figure 16B:
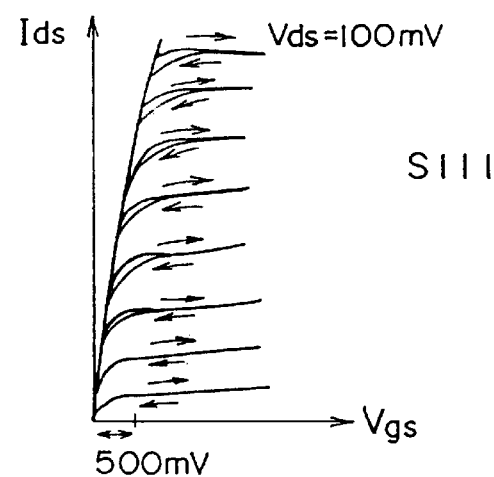
Figure 16C:
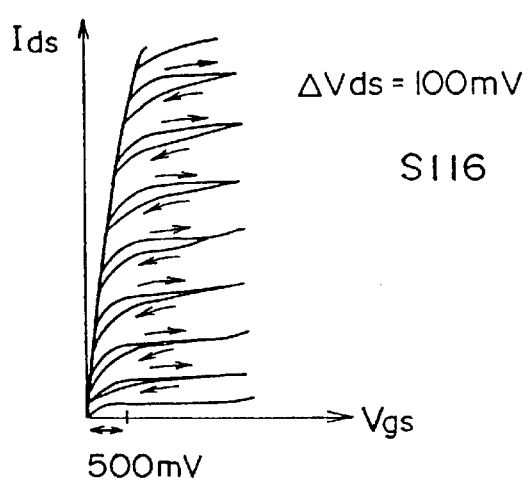
Figure 16D:
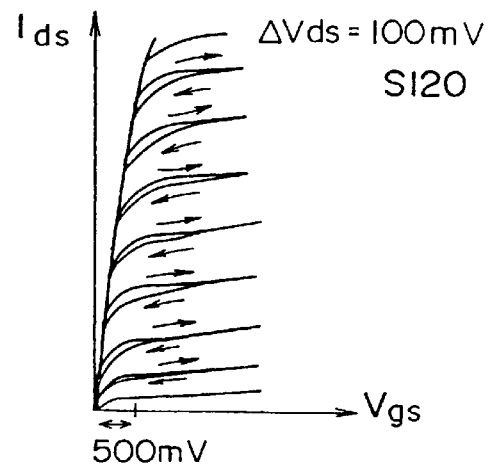

FIGS. 16(A)–16(D) compares the d.c. characteristics of the HEMT of FIG. 14, wherein FIG. 16(A) shows the characteristics for the device wherein the buffer layer 92 is formed according to the run #S113, FIG. 16(B) shows the characteristics for the device wherein the buffer layer 92 is formed according to the run #S111, and FIG. 16(C) shows the characteristics for the device wherein the buffer layer 92 is formed according to the run #S116. Further, FIG. 16(D) shows the characteristics for the device wherein the buffer layer is formed according to the run #S120. In FIGS. 16(A)–16(D), the measurement of the characteristics was made by applying a source-drain voltage of 100 mV.

As will be seen from the drawings, there appears a hysteresis loop in the operational characteristics of the HEMT, wherein it will be noted that such a hysteresis loop appears most conspicuously in the device of FIG. 16(C) that corresponds to the run #S116 of TABLE I, while the hysteresis loop is least significant in the device of FIG. 16(A). Further, the device of FIG. 16(B) corresponding to the run #S111 as well as the device corresponding to the run #S120 of FIG. 16(D) show a fairly acceptable, intermediate hysteresis. It is believed that such a hysteresis loop appears as a result of the oxygen dopants forming a shallow impurity level in the AlGaAs crystal forming the buffer layer 92. Upon cyclic application of a high frequency electric field, such a shallow impurity level responds to the electric field and causes emission or absorption of electrons. It is believed that such cyclic emission and absorption of the carriers causes the undesirable hysteresis loop in the d.c. operational characteristics.

Figure 17:
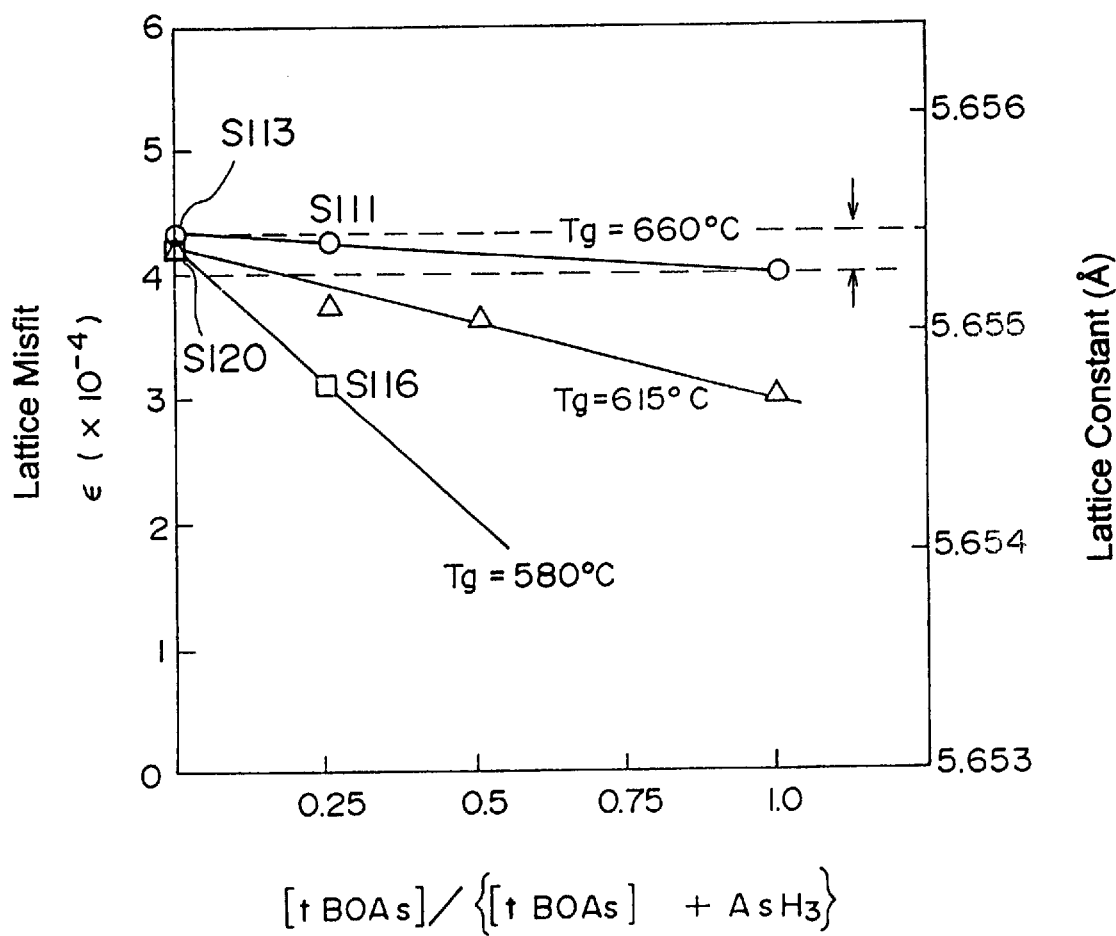
FIG. 17 is a diagram showing the relationship between the lattice constant and the oxygen doping for the AlGaAs crystal that forms the buffer layer of the HEMT of FIG. 14.

FIG. 17 shows the relationship between the lattice constant of the AlGaAs buffer layer 92 as a function of the proportion of the tBOAs dopant in the gaseous source of As, wherein the vertical axis at the right indicates the lattice constant of AlGaAs while the vertical axis at the left indicates the lattice misfit $\epsilon$ of an AlGaAs crystal with respect to a GaAs crystal for various oxygen contents in the AlGaAs crystal.

Referring to FIG. 17, it will be noted that the lattice constant of AlGaAs generally decreases with increasing content of tBOAs in the gaseous source of As in correspondence to the increased concentration level of oxygen in the AlGaAs buffer layer 92. It should be noted that oxygen has a much smaller atomic radius than arsenic. FIG. 17 further indicates that the rate of decrease of the lattice constant changes substantially with temperature. Thus, at the temperature of 660° C., the rate of change is small, while the slope of the line indicating the rate of change of the lattice constant increases substantially at the temperature of 615° C. At the temperature of 580° C., this tendency is further enhanced.

As the proportion of the oxygen dopant generally corresponds to the oxygen concentration in the AlGaAs layer as described previously, the relationship of FIG. 17 indicates that the lattice constant of AlGaAs changes with the deposition temperature even when the composition of the layer is the same including the oxygen content. Such a variable lattice constant indicates that the oxygen atoms occupy different sites in the crystal structure of AlGaAs. More particularly, the crystal in which arsenic is substituted by oxygen has the smallest lattice constant, while the crystal that contains oxygen in the interstitial site has the largest lattice constant as a result of the interstitial oxygen atoms that compensate for the shrinkage of the lattice constant caused by the incorporation of small-diameter oxygen atoms. In order to eliminate the undesirable loop of operational characteristics, it is therefore necessary to set the temperature of deposition as high as possible so that the difference of the lattice constant with respect to the undoped composition becomes minimum. On the other hand, use of high deposition temperature tends to invite the side gate effect when the oxygen doping is insufficient.

FIG. 17 indicates that the runs #S111, #S113 and #S120, which show the allowable, small hysteresis loop, fall in a range 6 for the lattice discrepancy E of about $2\times10^{-5}$, while the run #S116 or the data for 615° C. represented by triangles fall outside the foregoing region. In other words, one can represent the AlGaAs crystal suitable for the buffer layer 92 in terms of the oxygen concentration level and the lattice constant.

Summarizing the foregoing results of FIGS. 15(A)–15(D) with the results of FIGS. 16(A) 16(D) and further in view of the result of FIG. 17, it is concluded that the temperature of deposition of the buffer layer has to be selected in combination with the proportion of the oxygen dopant in the gaseous source of arsenic such that, when the temperature is set lower than the foregoing temperature of 630° C., the proportion of the oxygen dopant has to be set well below 25%, preferably less than 4%. When the temperature is set equal to or higher than 630° C., the proportion of the oxygen dopant is set above 4%, preferably 25% or more in order to achieve the foregoing oxygen concentration level of $1 \times 10^{18}$ $cm^{-3}$ or more.

As the deposition temperature of less than 630° C. is undesirable in view point of the crystal quality, it is preferable to set the temperature of deposition at 630° C. or more and supply the oxygen dopant simultaneously in order to obtain an effective buffer layer. Thereby, it is preferable to supply oxygen dopant with a proportion of 4% or more, more preferably 25% or more. The AlGaAs crystal thus obtained typically contains oxygen with a concentration level of $1 \times 10^{18}$ $cm^{-3}$ or more and carbon with a concentration level of $5 \times 10^{17}$ $cm^{-3}$ or less. The AlGaAs layer thereby has a lattice constant larger than the lattice constant of the GaAs substrate, wherein the discrepancy $\delta$ in the lattice misfit $\epsilon$ with respect to an AlGaAs crystal free from oxygen doping, is less than $2 \times 10^{-5}$. By optimizing the deposition condition of the buffer layer 92, one can obtain a HEMT wherein the side gate effect is minimized and simultaneously the hysteresis loop in the operational characteristics is minimized.

In the foregoing description, the growth of the oxygen-containing AlGaAs layer has been achieved by using tBOAs for the source of O and As. However, the source of O and As that can be used in the process of the present invention is not limited to tBOAs but other organic sources of As can also be used. These organic sources include: monoethoxy arsine ($C_2H_5OAsH_2$); monophenoxy arsine ($C_6H_5OAsH_2$); monomethoxy arsine ($CH_3OAsH_2$); ditertiary buthoxy arsine (($C_4H_9O)_2AsH$); diethoxy arsine (($C_2H_5O)_2AsH$); diphenoxy arsine (($C_6H_5O)_2AsH$); dimethoxy arsine (($CH_3O)_2AsH$); tritertiary buthoxy arsine (($C_4H_9O)_3As$); triethoxy arsine (($C_2H_5O)_3As$); triphenoxy arsine (($C_6H_5O)_3As$); and trimethoxy arsine (($CH_3O)_3As$).

According to the present invention, one can introduce oxygen into a reaction vessel without causing a contamination. As oxygen is supplied in the form of organic molecules of the source gas of the group V element and as the source gas of the group V element is supplied with much larger amount as compared with the source gas of the group III element, a large amount of oxygen ions can be incorporated into the reaction vessel and hence into the epitaxial layer. By using such an epitaxial layer that contains large amount of oxygen ions as the impurity for the buffer layer, one can achieve an effective device isolation.

It should be noted that the semiconductor devices described heretofore may be provided also on a silicon substrate by providing an intervening buffer layer of GaAs between the silicon substrate and the AlGaAs buffer layer.

Further, the present invention is not limited to the embodiments described heretofore, but various variations and modifications may be made without departing from the scope of the invention.

What is claimed is:

1. A semiconductor device, comprising:

a substrate of GaAs;

an active layer of a compound semiconductor material provided on said substrate, said active layer including therein an active device;

a buffer layer of AlGaAs provided between said substrate and said active layer, said buffer layer containing oxygen in a concentration within the approximate range of $8 \times 10^{17}$ $cm^{-3}$ to $6 \times 10^{19}$ $cm^{-3}$ and carbon in a concentration within the approximate range of $2 \times 10^{16}$ $cm^{-3}$ to $2 \times 10^{17}$ $cm^{-3}$;

said buffer layer of AlGaAs having a lattice constant that is smaller than a lattice constant of an undoped AlGaAs crystal identical in composition with said buffer layer but undoped with oxygen;

wherein said lattice constant of said AlGaAs buffer layer is larger than a lattice constant of said GaAs substrate such that a lattice misfit of said AlGaAs buffer layer with respect to said GaAs substrate is equal to or varies by no more than $2 \times 10^{-5}$ from a corresponding lattice misfit between said undoped AlGaAs crystal with respect to said GaAs substrate.

2. A semiconductor device as claimed in claim 1, wherein said buffer layer contains oxygen in a concentration within the approximate range of $8 \times 10^{17}$ $cm^{-3}$ to $3 \times 10^{18}$ $cm^{-3}$ and wherein said buffer layer contains carbon in a concentration within the approximate range of $2 \times 10^{16}$ $cm^{-3}$ to $7 \times 10^{16}$ $cm^{-3}$.

3. A semiconductor device as claimed in claim 1, wherein said buffer layer comprises AlGaAs having a composition represented as $Al_xGa_{1-x}As$ wherein the parameter x is set to approximately 0.2 or more.

4. A semiconductor device, comprising:

a substrate of GaAs;

an active layer of a compound semiconductor material provided on said substrate, said active layer including therein an active device;

a buffer layer of AlGaAs provided between said substrate and said active layer, said buffer layer containing oxygen with a level equal to or larger than approximately $8 \times 10^{17}$ $cm^{-3}$ but not exceeding approximately $6 \times 10^{19}$ $cm^{-3}$;

said buffer layer of AlGaAs having a lattice constant such that a lattice misfit of said AlGaAs buffer layer with respect to said GaAs substrate is equal to or varies by no more than $2 \times 10^{-5}$ from a corresponding lattice misfit between an AlGaAs crystal which is free of oxygen and said GaAs substrate.

5. A semiconductor device as claimed in claim 4, wherein said buffer layer contains oxygen in a concentration within the approximate range of $8 \times 10^{17}$ $cm^{-3}$ to $3 \times 10^{18}$ $cm^{-3}$ and wherein said buffer layer contains carbon in a concentration within the approximate range of $2 \times 10^{16}$ $cm^{-3}$ to $7 \times 10^{16}$ $cm^{-3}$.

* * * * *